United States Patent
Karim et al.

(10) Patent No.: US 12,374,569 B2
(45) Date of Patent: Jul. 29, 2025

(54) BATCH PROCESSING OVEN FOR MAGNETIC ANNEAL

(71) Applicant: Yield Engineering Systems, Inc., Fremont, CA (US)

(72) Inventors: M. Ziaul Karim, Los Gatos, CA (US); Christopher Lane, Los Altos, CA (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 643 days.

(21) Appl. No.: 17/505,930

(22) Filed: Oct. 20, 2021

(65) Prior Publication Data
US 2023/0117184 A1    Apr. 20, 2023

(51) Int. Cl.
*H01L 21/67*    (2006.01)
*H01L 21/677*    (2006.01)

(52) U.S. Cl.
CPC .. *H01L 21/67109* (2013.01); *H01L 21/67745* (2013.01); *H01L 21/67754* (2013.01); *H01L 21/67757* (2013.01); *H01L 21/67781* (2013.01)

(58) Field of Classification Search
CPC ............. H01L 21/324; H01L 21/67109; F27B 17/0025
See application file for complete search history.

(56) References Cited

U.S. PATENT DOCUMENTS

| 4,597,736 A | 7/1986 | Moffat |
| 5,405,122 A | 4/1995 | Burrage et al. |
| 5,516,283 A | 5/1996 | Schrems |
| 5,525,780 A | 6/1996 | Moslehi |
| 5,662,470 A | 9/1997 | Huussen et al. |
| 5,942,962 A * | 8/1999 | Gery ...................... H01F 7/0278 335/297 |
| 6,198,075 B1 | 3/2001 | Moffat |
| 6,225,602 B1 | 5/2001 | Buijze et al. |
| 6,455,815 B1 * | 9/2002 | Melgaard .................. F27B 5/14 219/393 |
| 6,780,225 B2 | 8/2004 | Shaw et al. |
| 6,879,779 B2 | 4/2005 | Melgaard |
| 8,361,548 B2 | 1/2013 | Moffat et al. |

(Continued)

FOREIGN PATENT DOCUMENTS

| EP | 1155437 B1 * | 8/2008 | ......... C23C 16/4411 |
| TW | 108105189 | 10/2019 | |

(Continued)

*Primary Examiner* — Edelmira Bosques
*Assistant Examiner* — Michael James Giordano
(74) *Attorney, Agent, or Firm* — Finnegan, Henderson, Farabow, Garrett & Dunner, LLP

(57) ABSTRACT

A batch processing oven includes a processing chamber, a magnet, and a rack. The processing chamber includes a gas inlet on a first side and a gas outlet on a second side opposite the first side, the gas inlet is configured to direct a hot gas into the processing chamber and the gas outlet is configured to exhaust the convective energy in parallel with the radiative energy from the walls. The magnet is arranged such that its north pole will be formed on the first side of the processing chamber and its south pole will be formed on the second side of the processing chamber. The rack is configured to be positioned between the first and second ends of the processing chamber and is configured to support a plurality of vertically spaced-apart substrates.

20 Claims, 9 Drawing Sheets

(56) References Cited

U.S. PATENT DOCUMENTS

| | | |
|---|---|---|
| 9,410,742 B2 | 8/2016 | Colgan et al. |
| 10,003,018 B1 | 6/2018 | Colgan et al. |
| 10,147,616 B2 | 12/2018 | Moffat et al. |
| 10,490,431 B2 | 11/2019 | Moffat et al. |
| 11,088,002 B2 | 8/2021 | Pierreux et al. |
| 2005/0186723 A1 | 8/2005 | Kim |
| 2007/0167026 A1 | 7/2007 | Miura |
| 2008/0023141 A1 | 1/2008 | Shimizu et al. |
| 2009/0145890 A1 | 6/2009 | Matsuura et al. |
| 2009/0305512 A1* | 12/2009 | Matsuura .......... C23C 16/45591 118/724 |
| 2012/0000425 A1 | 1/2012 | Park et al. |
| 2012/0067521 A1 | 3/2012 | Shimomura et al. |
| 2012/0258415 A1* | 10/2012 | Yoshii ................ H01L 21/67248 432/9 |
| 2016/0069613 A1* | 3/2016 | Colgan ............. H01L 21/67303 438/795 |
| 2019/0017169 A1* | 1/2019 | Hanashima ....... H01L 21/67393 |
| 2019/0314738 A1 | 10/2019 | Moffat et al. |
| 2019/0371506 A1 | 12/2019 | Colgan et al. |
| 2020/0013591 A1 | 1/2020 | Moffat et al. |
| 2021/0043485 A1* | 2/2021 | Saido ................ C23C 16/45574 |
| 2021/0265301 A1 | 8/2021 | Karim et al. |

FOREIGN PATENT DOCUMENTS

| | | |
|---|---|---|
| WO | WO 2019/099401 | 5/2019 |
| WO | WO 2019/161109 | 8/2019 |

* cited by examiner

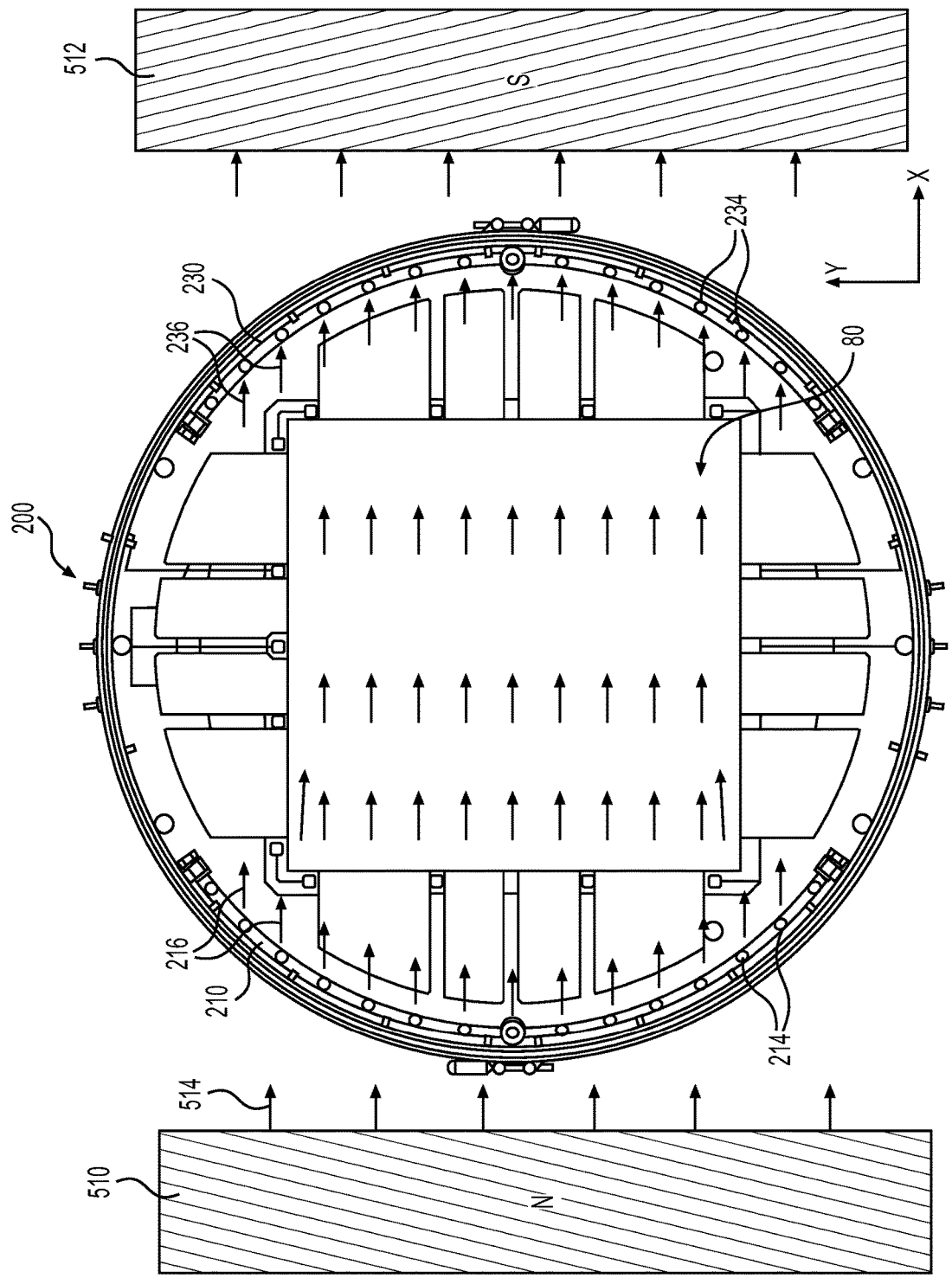

BATCH PROCESSING OVEN FOR MAGNETIC ANNEAL

TECHNICAL FIELD

The current disclosure relates to batch processing ovens that may be used for magnetic annealing and methods of using these ovens.

BACKGROUND

Semiconductor technology, such as, for example, Hard Disk Drive (HDD) technology as well as Semiconductor Random Access Memory (RAM) technology, has undergone substantial technical challenges to increase capacity and reduce the size of Integrated Circuit (IC) devices or media they produce. Increases in HDD recording density have enabled higher recording capacity, exceeding, for e.g., 1 $Tb/in^2$, enabled by perpendicular magnetic recording and recently heat assisted magnetic recording. Magnetic RAM (MRAM) is an emerging memory technology using magnetic electron spin to store information.

Both technologies use magnetic materials in processing media. After deposition, these magnetic materials go through patterning, cleaning, and electrode deposition steps. These process steps may cause crystal mis-orientation, grain boundary interface issues, lattice strain reduction, texture variation, and above all, magnetic domain mis-orientation. The batch processing ovens of the current disclosure may alleviate one or more of the above-described issues. For example, the disclosed ovens enables combining magnetic assembly processes and thermal assembly processes to repair crystal orientation, improve grain boundary interface and texture variation, and provide domain alignment.

SUMMARY

Multiple embodiments of a batch processing oven and methods of using the oven are disclosed. Both the foregoing general description and the following detailed description are exemplary and explanatory only. As such, the scope of the disclosure is not limited solely to the disclosed embodiments. Instead, it is intended to cover such alternatives, modifications, and equivalents as are within the scope and spirit of the present disclosure. Persons skilled in the art would understand that and how various changes, substitutions, and alterations can be made to the disclosed embodiments without departing from the scope or spirit of the disclosure.

In one aspect, a batch processing oven is disclosed. The oven may include a processing chamber, a magnet, and a rack to hold substrates. The processing chamber may have a gas inlet configured to direct a hot gas into the processing chamber and a gas outlet configured to exhaust the hot gas from the processing chamber. The gas inlet may be positioned on a first side of the processing chamber and the gas outlet may be positioned on a second side of the processing chamber, opposite the first side. The magnet may be configured to have a north pole and a south pole. The north pole may be positioned on the first side of the processing chamber and the south pole may be positioned on the second side of the processing chamber. The rack may be configured to be positioned between the first and second sides of the processing chamber. The rack may be configured to support a plurality of vertically spaced-apart substrates.

In another aspect, a method of operating a batch processing oven is disclosed. The method may include positioning a rack in a processing chamber of the oven. The rack may support a plurality of substrates in a stacked manner such that vertical gaps separate each substrate of the plurality of substrates from an adjacent substrate. The method may also include directing a flow of a hot gas through the rack from a first side of the processing chamber to a second side of the processing chamber opposite the first side. The method may further include activating a magnetic field through the rack. A direction of the magnetic field may be from the first side to the second side.

In yet another aspect, a semiconductor processing oven is disclosed. The oven may include a cylindrical or rectangular processing chamber, a gas inlet positioned on a first side of the processing chamber, and a gas outlet positioned on a second side of the processing chamber diametrically, opposite the first side. The gas inlet may include multiple inlet tubes extending in a lengthwise direction along an internal wall of the processing chamber. The multiple inlet tubes may be arranged circumferentially to form a partial arc around the internal wall. Each inlet tube of the multiple inlet tubes may include a plurality of inlet ports spaced apart from each other in the lengthwise direction. The plurality of inlet ports may be configured to direct a hot gas into the processing chamber. The gas outlet may be configured to exhaust the hot gas from the processing chamber. The oven may also include a magnet configured to have a north pole and a south pole. The north pole may be positioned on the first side of the processing chamber and the south pole may be positioned on the second side of the processing chamber. A rack may be configured to be positioned in the processing chamber. The rack may be configured to support a plurality of substrates, stacked so that vertical gaps separate each substrate from an adjacent substrate on either side.

BRIEF DESCRIPTION OF THE DRAWINGS

The accompanying drawings, which are incorporated in and constitute a part of this disclosure, illustrate exemplary embodiments and, together with the description, are used to explain the disclosed principles. In these drawings, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. Unless indicated otherwise, the figures should not be viewed as representing proportional relationships between different features in a figure. Further, aspects of the disclosure described with reference to one embodiment or figure may also be applicable to, and may be used with, other embodiments or figures.

FIGS. 4A-4D are illustrations of an exemplary process chamber of the oven of FIG. 1A.

DETAILED DESCRIPTION

All relative terms such as "about," "substantially," "approximately," etc. are used to indicate a possible variation of ±10% (unless noted otherwise or another variation is specified). For example, a feature disclosed as being about "t" units long (wide, thick, etc.) may vary in length from (t−0.1t) to (t+0.1t) units. Similarly, a temperature within a range of about 100-150° C. can be any temperature between (100−10%) and (150+10%). In some cases, the specification also provides context to some of the relative terms used. For example, a structure described as being substantially cylindrical may deviate slightly (e.g., 10% variation in diameter at different locations, etc.) from being perfectly cylindrical. Further, a range described as varying from, or between, 1 to 10 (1-10), includes the endpoints (i.e., 1 and 10).

Unless defined otherwise, all terms of art, notations, and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein are incorporated by reference in their entirety. If a definition or description set forth in this disclosure is contrary to, or otherwise inconsistent with, a definition and/or description in these references, the definition and/or description set forth in this disclosure prevails over those in the references that are incorporated by reference. None of the references described or referenced herein is admitted as prior art to the current disclosure.

Figure 1A:
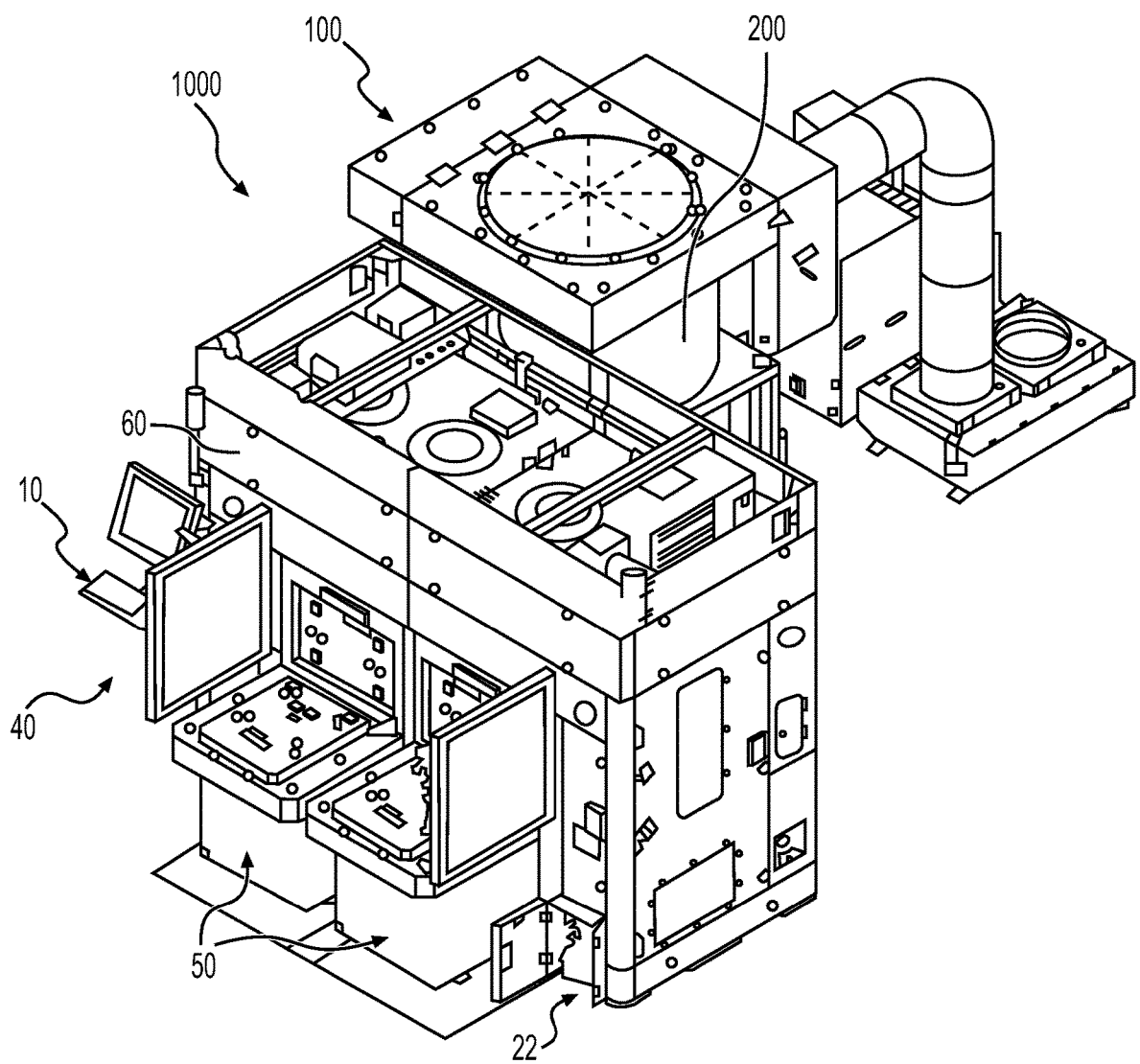
FIGS. 1A and 1B illustrate an exemplary batch processing oven of the current disclosure.
Figure 1B:
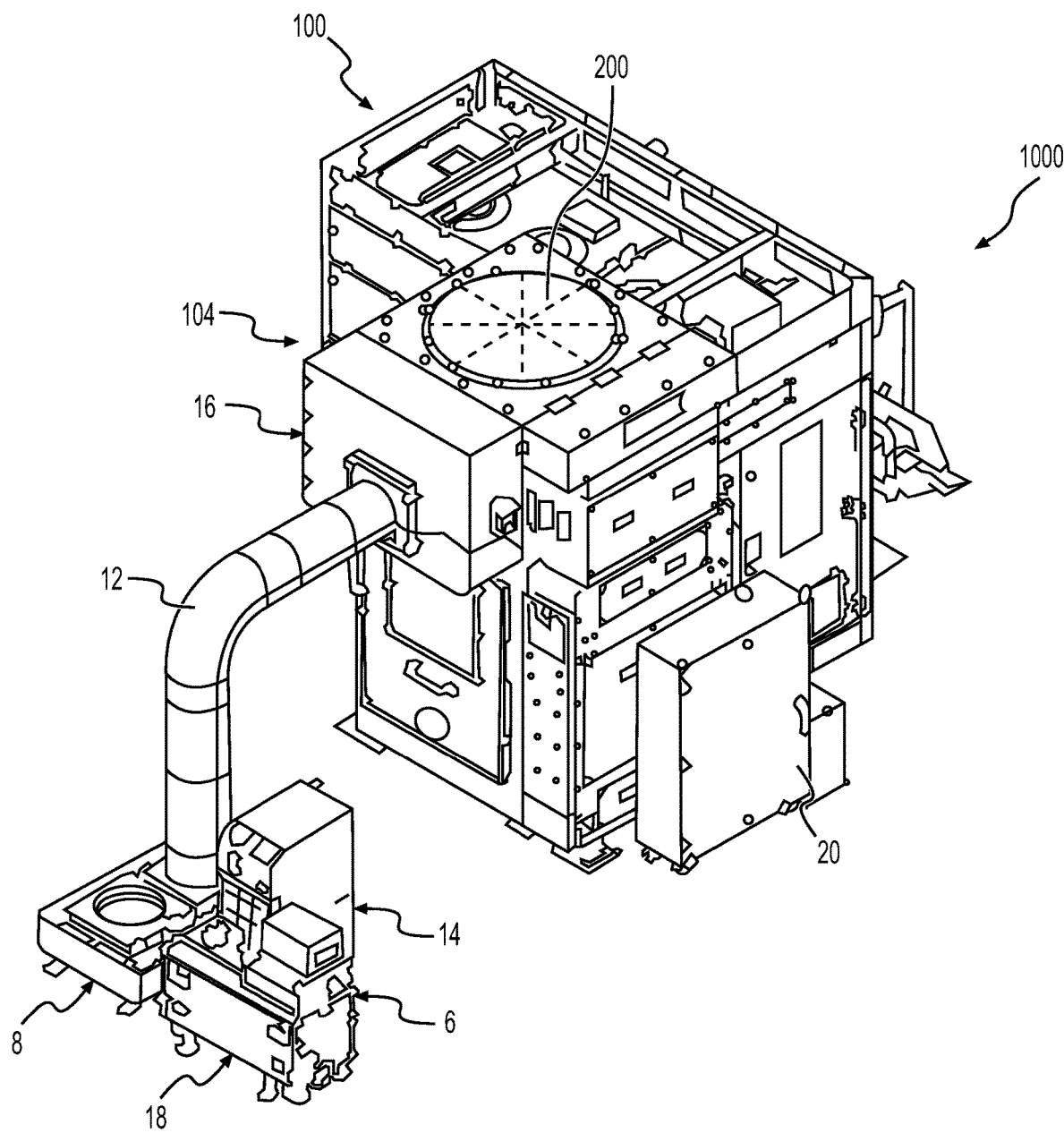

FIGS. 1A and 1B illustrate different views of an exemplary batch processing oven 1000 (or furnace) of the current disclosure. An operator works at the GUI 10 (graphic user interface) on an Equipment Front End Module (EFEM 60) where substrates are introduced into oven 1000 via load ports 50. Oven 1000 includes a process module 100 with a process chamber 200 (see FIGS. 2A and 2B). A vacuum pump 18 is connected to process chamber 200 via a fore line. A duct interface 16 controls air flow to process chamber 200 from a duct 12 and a blower 8. An oxygen analyzer 6 connected to the pump exhaust is used to monitor the concentration of oxygen in process chamber 200. A chiller 14 supplies cooling water to pump 18, and a power module 20 supplies electric power to process chamber 200, EFEM 60, and blower 8. Process gas (e.g., nitrogen, etc.) and other gases are directed into oven 1000 through a facilities panel 22.

Oven 1000 includes multiple load ports 50 used to load workpieces (e.g., wafers, substrates, devices, etc.) that are to be processed in process chamber 200. In some embodiments, one or more cassettes, or front opening unified pods (FOUPs) are placed in load ports 50 which indexes a door plate between the FOUPs and allows access to a robot inside EFEM 60 to pick and/or place the substrates 32 (see FIG. 2B). The robot picks up a substrate 32 from a FOUP in a load port 50 and transfers the substrate into a rack 80 (see FIG. 2B). The desired number of substrates 32 (between 1-200) are thus transferred from the FOUPs into rack 80. In some embodiments, the substrates are transferred from the FOUPs into rack 80 until all the available slots in rack 80 are filled or the FOUPs are empty.

Figure 2A:
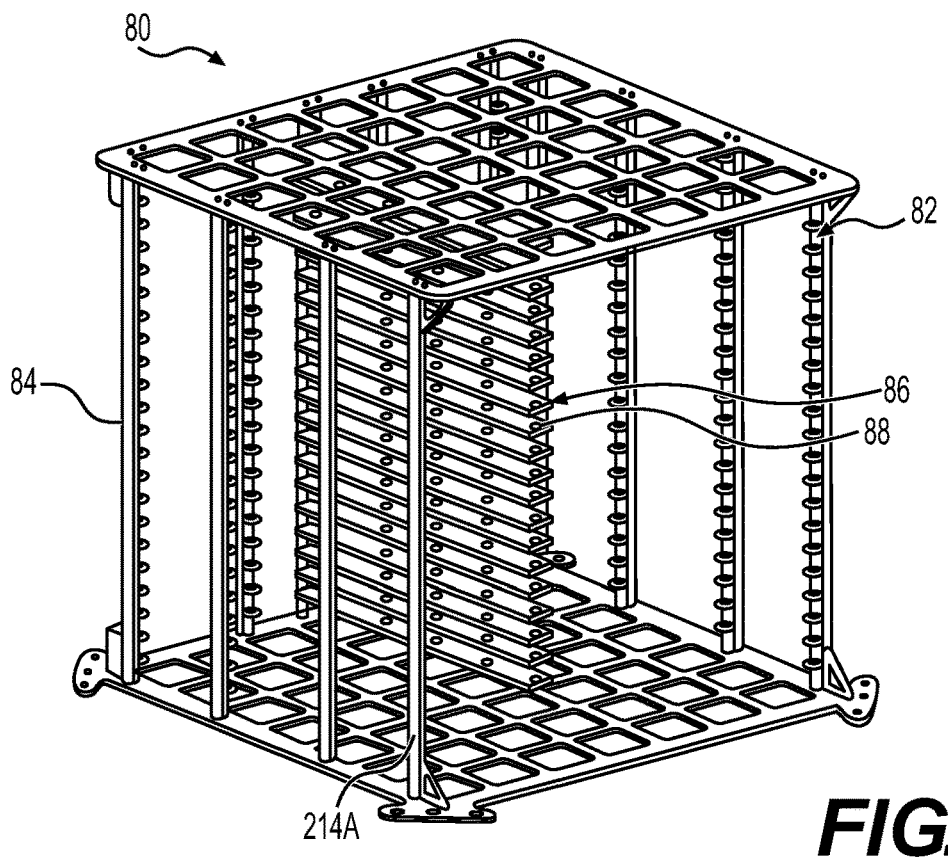
FIGS. 2A and 2B are illustrations of an exemplary rack used to support substrates in the oven of FIG. 1A.
Figure 2B:
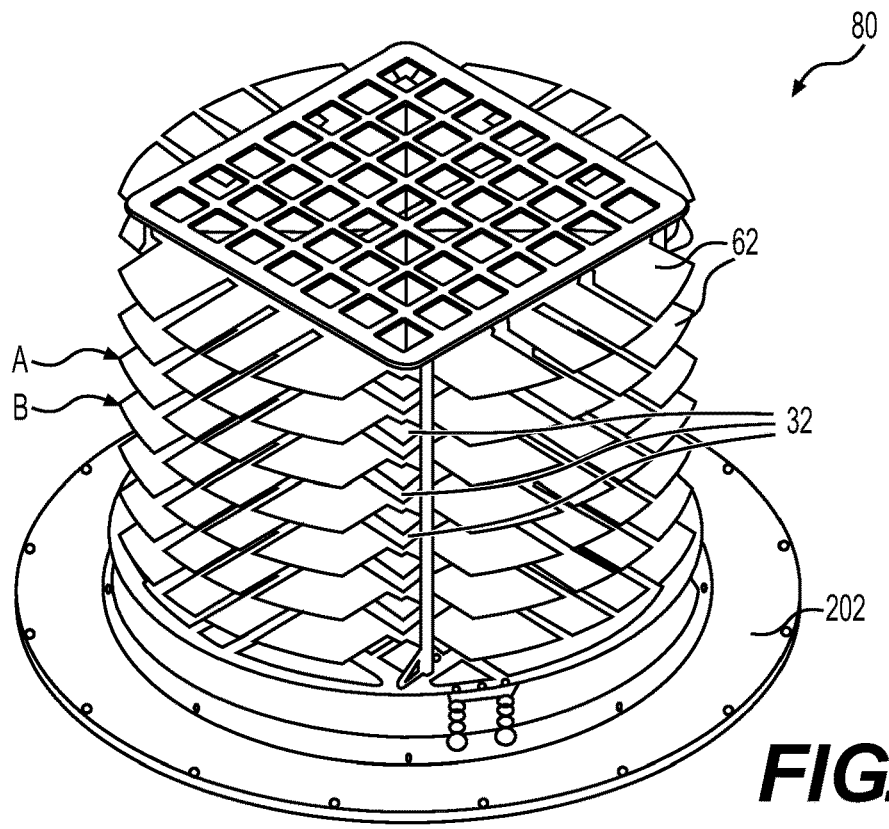

FIGS. 2A and 2B illustrate an exemplary rack 80 that may be used to support substrates 32. FIG. 2A illustrates an empty rack 80 and FIG. 2B illustrates a rack 80 loaded with substrates 32 and panels 62 (discussed later). With reference to FIG. 2A, rack 80 includes a support structure 82 for supporting substrates 32 and panels 62. In some embodiments, support structure 82 may include peripheral supports 84 positioned around the outer boundary of rack 80 and central supports 86 with buttons 88 to support the substrates 32 and panels 62 loaded on rack 80. The support structure 82 may be made of any material (such as, for example, metal, quartz or ceramic) that will withstand operating conditions and not contaminate substrates 32. Rack 80 may include one or more thermocouples (not shown) configured to measure the temperature of substrates 32 during processing. These thermocouples may be placed along the center supports preferably near the substrate center in the upper, middle, and lower regions of rack 80 for providing feedback to a control system 40 (see FIG. 1A) of oven 1000 for heating uniformly all regions of process chamber 200.

As can be seen in FIG. 2B, panels 62 may have a plate-like configuration and may be made of any thermally conductive and reflective material (e.g., aluminum) that is configured to radiate heat. Panels 62 may be removably or fixedly coupled to support structure 82 of rack 80. One or more substrates 32 may be removably placed in rack 80 (e.g., by a robotic pick-and-place system) between two panels 62. Substrate 32 may include any component (e.g., printed circuit boards, IC chips, semiconductor wafers, etc.) that is desired to be processed in process chamber 200. In some embodiments, a single substrate 32 may be positioned between two adjacent panels 62 (for example, between panels 62 marked A and B in FIG. 2B). In some embodiments, multiple (e.g., two) substrates 202 may be positioned in a vertically spaced-apart manner between two adjacently positioned panels 62 (e.g., between panels A and B). For example, in some embodiments, two substrates 32 are positioned in a vertically spaced-apart manner between the two panels 62 (e.g., panels A and B) such that a vertical gap is formed between each of the two substrates 32 and the two panels 62 (i.e., panels A and B) on the top and bottom the pair of substrates 32. In some embodiments, only one substrate 32 may be positioned between two adjacent panels 62 (e.g., panels A and B). The same or a different number of substrates 202 may be positioned between each pair of adjacent panels 62 in rack 80. In some embodiments, substrates 32 may not be positioned between the pair of adjacent panels 62 at the top and bottom of rack 80, and two substrates 32 may be poisoned between every other pair of adjacent panels 62. In rack 80, substrates 32 and panels 62 are vertically spaced apart from each other by any value (between about 5-50 mm) such that they do not contact each other. Instead, a gas flow path is formed between them.

With reference to FIG. 2B, to load substrates 32 into process chamber 200, rack 80 loaded with substrates 32 and panels 62 is positioned on a seal plate 202 disposed below process chamber 200. Process chamber 200 includes a load port or a chamber opening at its bottom side. When rack 80 is positioned in process chamber 200, seal plate 202 serves as the door of process chamber 200. After the desired number of substrates 32 have been loaded into rack 80, an elevator assembly 300 lifts seal plate 202 to position rack 80 in process chamber 200. When rack 80 is positioned in process chamber 200, seal plate 202 mates or engages with a flange around the chamber opening of process chamber 200 to seal plate 202 against the walls of process chamber 200.

Figure 3A:
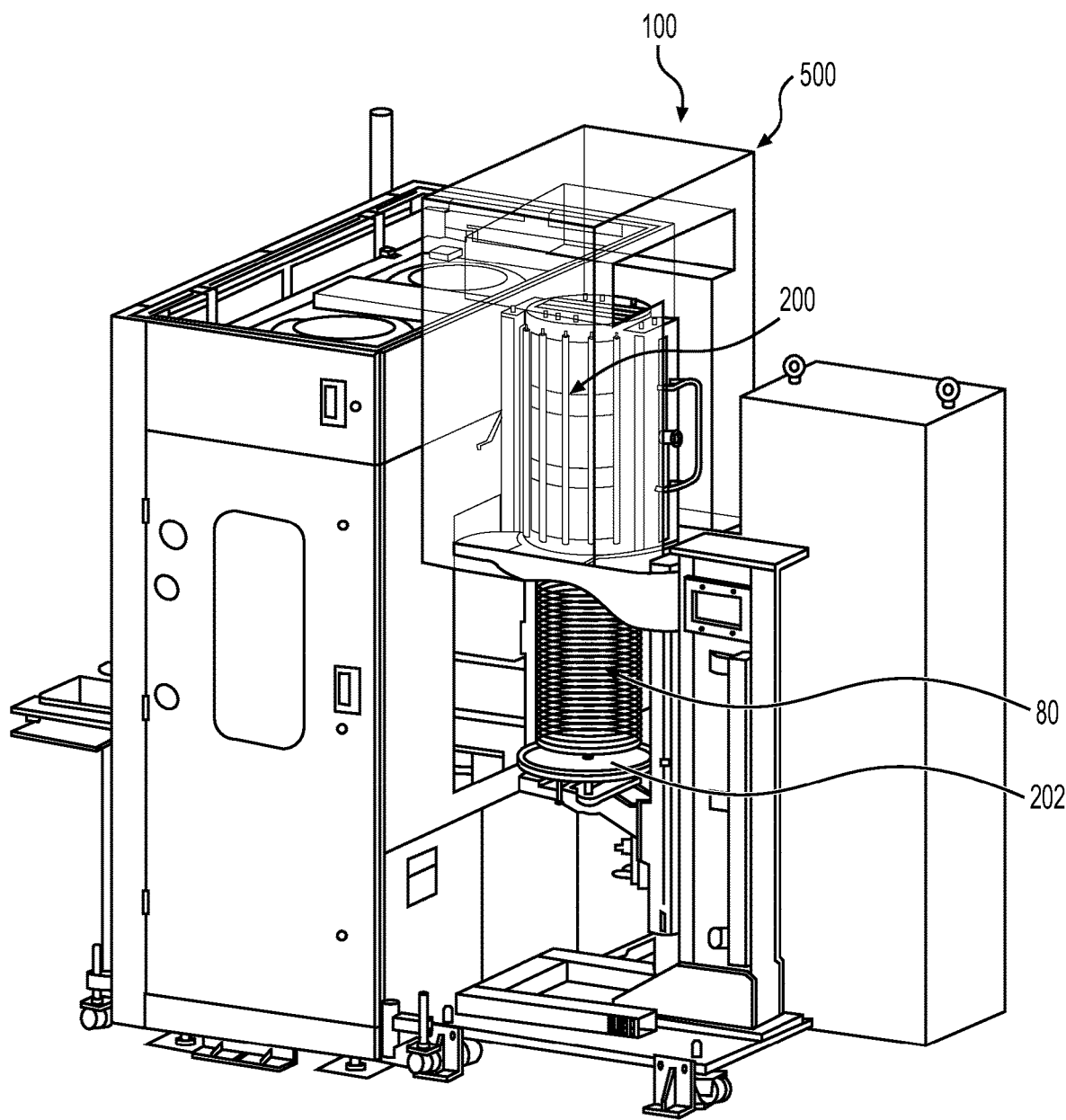
FIGS. 3A and 3B illustrate different views of an exemplary process module of the oven of FIG. 1A.
Figure 3B:
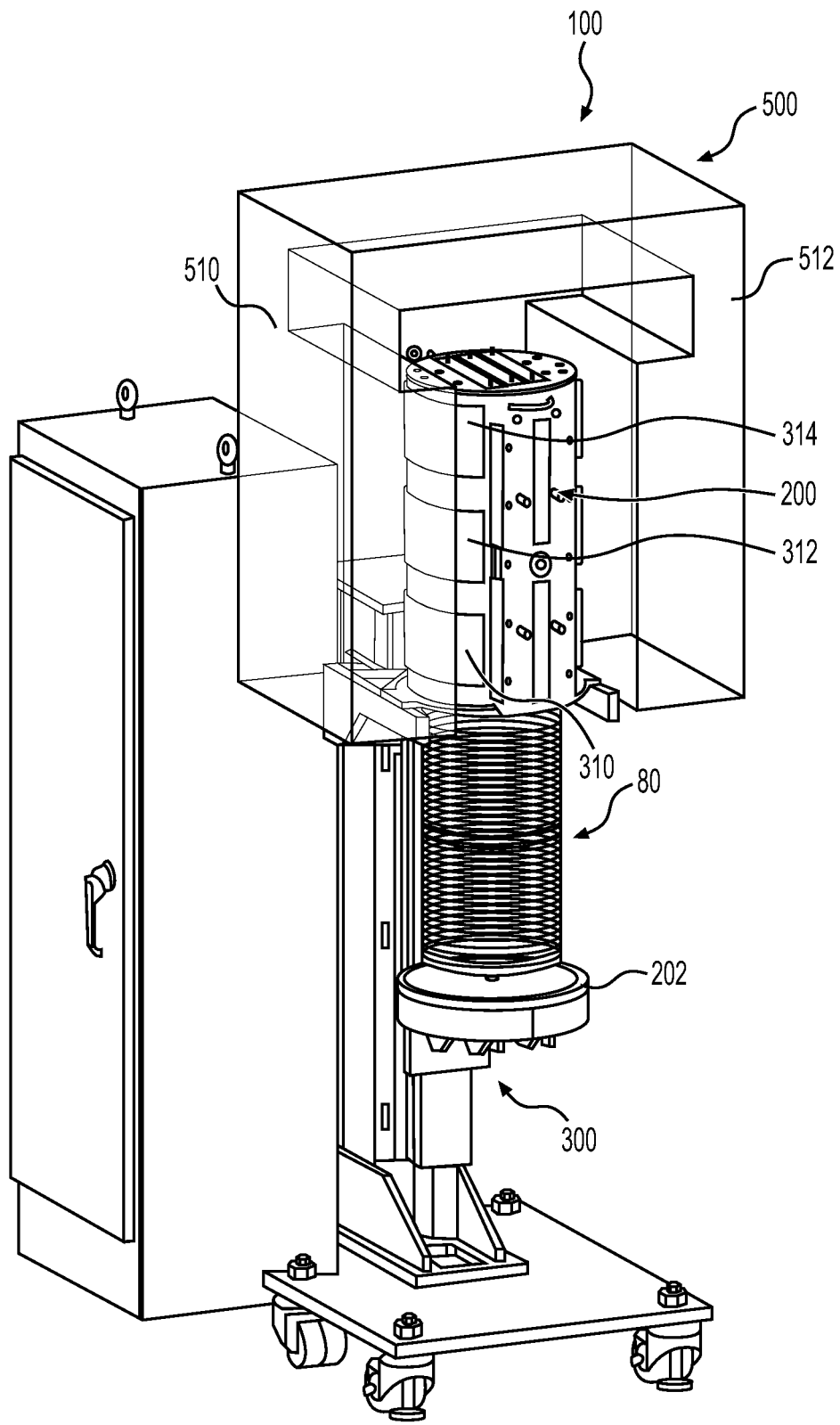

FIGS. 3A and 3B illustrate views of process module 100 (with components removed) showing process chamber 200. With reference to FIGS. 3A and 3B, process chamber 200 may be a substantially cylindrical hollow chamber that is configured to receive rack 80 therein. The size of process chamber 200 may vary based on application. Although not required, in some embodiments, both the internal diameter and height of process chamber 200 may vary between about 250-1000 mm. In some embodiments, the internal diameter of process chamber 200 may vary between about 250-380 mm and the internal height of process chamber 200 may vary between about 500-750 mm. Process chamber 200 may include heaters 310, 312, and 314 (e.g., band heaters) that extend circumferentially around the cylindrical outer wall of process chamber 200 (see FIG. 3B). In some embodiments, a thermal interface pad (e.g., a continuous graphite sheet, etc.) may be positioned between (e.g., sandwiched between) these heaters and the outer wall of process chamber 200 to improve conductive heat transfer from the heaters to the wall of chamber 200. The thermal interface pad may be relatively soft such that it fills the area between the heaters and the chamber wall and reduces the thermal interface resistance between them. During use, heaters 310, 312, 314 are configured to heat the wall of process chamber 200 by conduction, and the hot chamber walls to heat substrates 32 and panels 62 in rack 80 (e.g., by convection and/or radiation). As will be discussed in more detail below with reference to FIGS. 4A-4C, process chamber 200 also includes features configured to direct a heated (and cooled) gas into the internal cavity of chamber 200 to heat (and cool) substrates 32 and vary the pressure in the internal cavity of chamber 200.

Figure 4A:
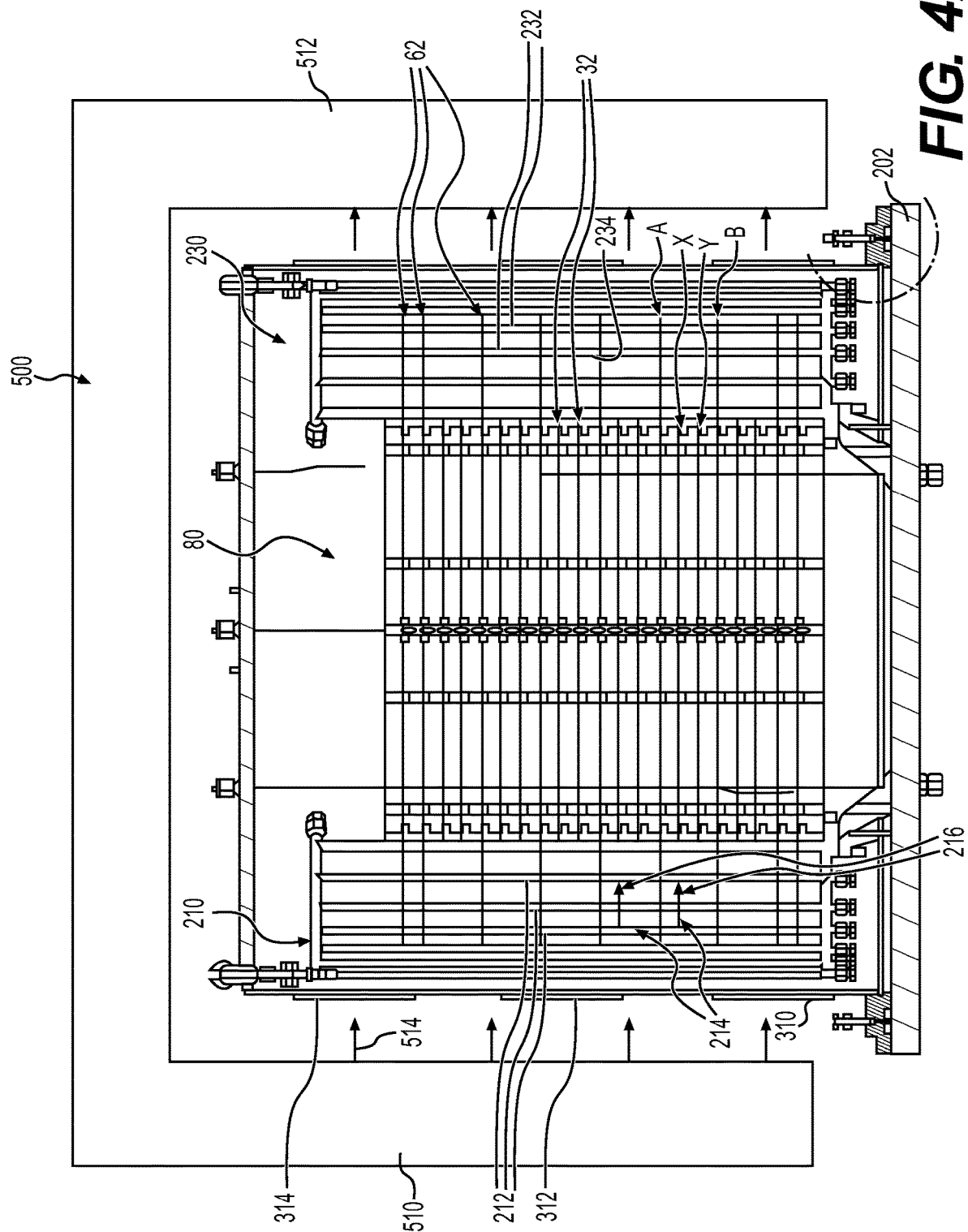
Figure 4C:
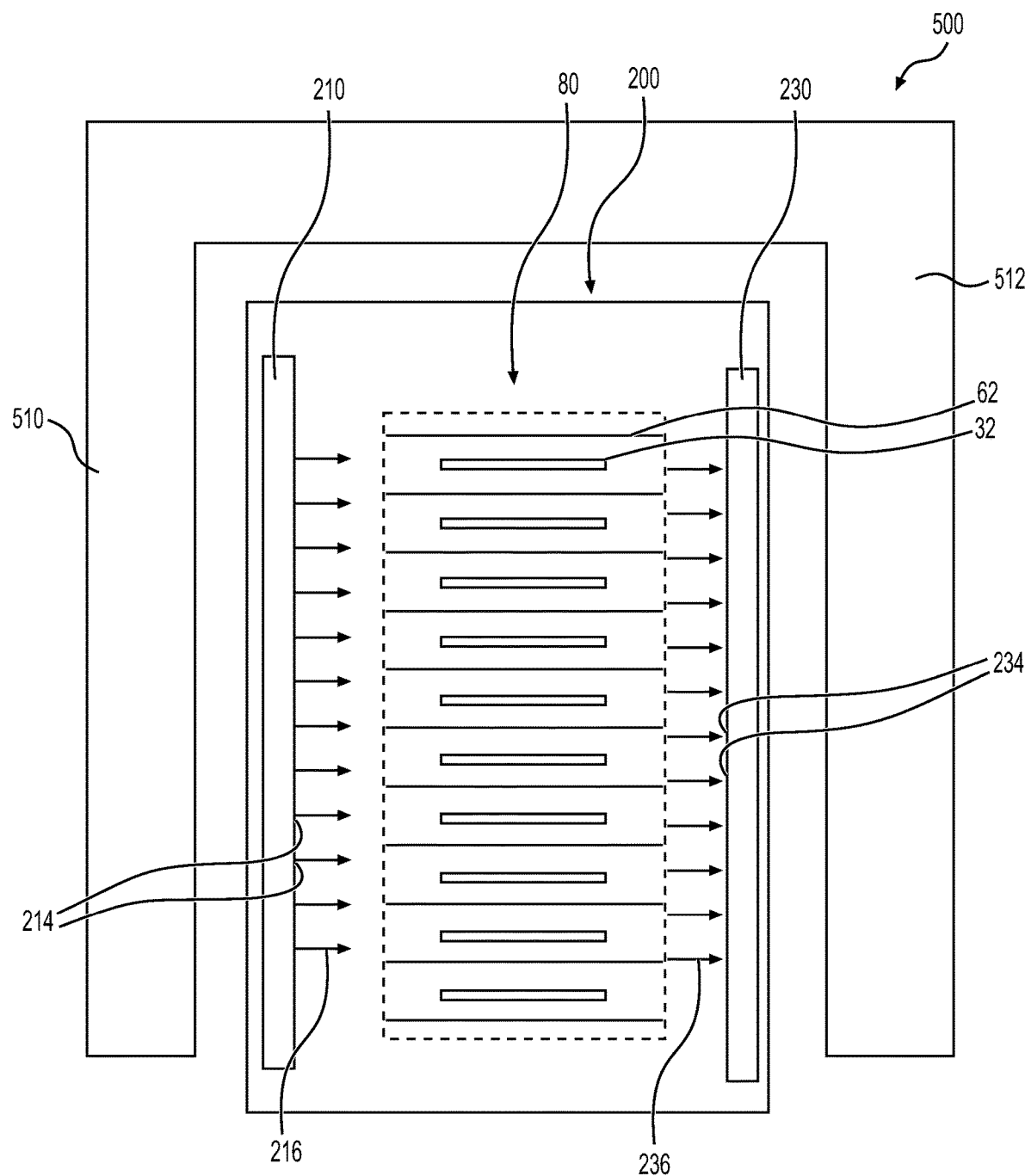

FIGS. 4A-4C illustrate different view of process chamber 200 with rack 80 positioned therein. FIGS. 4A and 4B illustrate cross-sectional views of process chamber 200 in vertical and horizontal planes, respectively, and FIG. 4C illustrates a simplified schematic representation of process chamber 200. Process module 100 may include one or more magnets (magnet 500) configured to direct a magnetic flux or magnetic field through process chamber 200. In some embodiments, magnet 500 may be positioned external to process chamber 200 such the magnetic flux from magnet 500 passes through the walls of process chamber 200. In some embodiments, the opposite poles 510, 512 (i.e., North and South poles) of the magnet 500 may be positioned proximate the external walls of the process chamber 200. Any type of magnet 500 (e.g., permanent magnet, electromagnet, etc.) may be used. In some embodiments (as illustrated in FIGS. 4A-4C), a horseshoe magnet may be used. Persons skilled in the art would recognize that a horseshoe magnet is generally U-shaped (permanent magnet or electromagnet) with its opposite magnetic poles 510, 512 forming a space between them. Magnet 500 may be positioned such that its opposite poles 510, 512 are positioned on diametrically opposite sides of process chamber 200. That is, process chamber 200 is positioned in the space or gap between the opposite poles of magnet 50.

When rack 80 (with substrates 32 and panels 62) is positioned in process chamber 200 with seal plate 202 sealing the volume of process chamber 200 from the outside environment (see FIGS. 4A and 4C), rack 80 may be substantially centrally positioned in process chamber 200. In some embodiments, sealing of seal plate 202 with process chamber 200 may be achieved by compressing two annular O-rings and providing a vacuum in the annular space between the two O-rings to minimize leakage of air into process chamber 200 during processing. U.S. Pat. No. 10,490,431 B2, which is incorporated by reference in its entirety herein, describes the sealing of process chamber 200 with seal plate 202 in more detail.

As explained previously, the substrates 32 and panels 62 are vertically spaced apart in rack 80. The vertical gap between the substates 32 and panels 62 allow hot gases to flow through rack 80 and heat substates 32 and panels 62 by convection. Additionally, panels 62 (e.g., panels A and B of FIG. 4A) positioned on either side of substates 32 (e.g., substrates x and y of FIG. 4A) in rack 80 allow these substrates (x, y) to be heated by radiation from the panels (A and B). For example, in addition to convection heat transfer from the hot gases (as will be described later), substrate x may be heated by radiation from panel A and substrate y may be heated by radiation from panel Y.

With reference to FIGS. 4A-4C, process chamber 200 includes a gas inlet 210 and a gas outlet 230. Gas inlet 210 may be positioned diametrically opposite the gas outlet 230 such that rack 80 is positioned between gas inlet 210 and gas outlet 230. One or both of gas inlet 210 and gas outlet 230 may include multiple (e.g., 6-20) tubes 212, 232 that extend vertically along the length of the cylindrical process chamber 200 (see FIG. 4A). These multiple tubes 212, 232 may be arranged circumferentially to form a partial arc around the inside of the cylindrical chamber wall. The multiple tubes 212 of gas inlet 210 are fluidly connected (e.g., at the top and/or bottom) and connected to a source of pressurized inert gas (e.g., nitrogen). Similarly, the multiple tubes 232 of gas outlet 230 are fluidly connected (e.g., at the top and/or bottom) and connected to a vacuum pump. The multiple tubes 212 of gas inlet 210 include openings, or gas intel ports 214, that directs a gas into chamber 200, and the multiple tubes 232 of gas outlet 230 include openings, or gas outlet ports 234, that direct the gas out of chamber 200.

In some embodiments, the location of the multiple tubes 212 of the gas inlet 210 may be adjustable in the circumferential direction of the process chamber 200. Additionally, or alternatively, in some embodiments, the location of the multiple tubes 232 of the gas outlet 230 may be adjustable in the circumferential direction of the process chamber 200. That is, with reference to FIG. 4B, the multiple tubes 212 of the gas inlet 210 (and/or the multiple tubes 232 of the gas outlet 230) may be collectively rotated in the process chamber 200 such that the angular (or theta) position of the gas inlet 210 in the processing chamber changes. In some embodiments, the angular position of each tube 212 (or 232) may be individually adjusted in the circumferential direction such that the spacing between adjacent tubes 212 (or 232) in the circumferential direction changes.

In some embodiments, the location of the multiple tubes 212 of the gas inlet 210 may be adjustable in the lengthwise direction of the process chamber 200. Additionally, or alternatively, in some embodiments, the location of the multiple tubes 232 of the gas outlet 230 may be adjustable in the lengthwise direction of the process chamber 200. That is, with reference to FIG. 4C, the multiple tubes 212 of the gas inlet 210 (and/or the multiple tubes 232 of the gas outlet 230) may be collectively moved (or translated) in the lengthwise direction of the process chamber 200 (i.e., moved up or down) such that the gas inlet 210 (or gas outlet 230) is positioned closer to the top or the bottom of the process chamber 200. It is also contemplated that, in some embodiments, the position of each tube 212 (or 232) may be individually adjusted in the lengthwise direction.

The gas flow into chamber 200 from intel ports 214 is shown using arrows 216 and the gas flow out of chamber 200 via outlet ports 234 is shown using arrows 236 (see FIG. 4C). The multiple intel and outlet ports 214, 234 may be vertically spaced apart along the length of each of the multiple tubes 212, 232 that form gas inlet and outlet 210, 230. As illustrated in FIG. 4C, in some embodiments, intel ports 214 may be positioned such that the gas emanating from these ports are directed into the vertical gap between the substrates 32 and panels 62 in rack 80. Inlet and outlet ports 214, 234 are positioned such that a laminar flow of gas is formed and this flow is directed from inlet to outlet port 214, 234 parallel to substrates 32 (and panels 62) in rack 80. Thus, the gas flow from inlet port 214 to outlet port 234 is in the same geometric plane (XY plane in FIG. 4B) as substrates 32 and panels 62 in rack 80.

In some embodiments, the size (e.g., diameter, width, etc.) of one or more inlet ports 214 may be adjusted, for example, to vary the amount of gas emanating from that inlet port 214 into process chamber 200. That is, the size of the orifice that forms an inlet port 214 may be varied. In some embodiments, the size of all inlet ports 214 may be adjustable, while in other embodiments, the size of selected inlet ports 214 may be adjustable. Additionally, or alternatively, in some embodiments, the size of one or more outlet ports 234 may be adjustable. In some embodiments, the location of one or more of the inlet ports 214 (and or the outlet ports 234) may be adjustable in the lengthwise direction of the process chamber 200. That is, the location of one or more inlet ports 214 in tube(s) 212 of the gas inlet 210 may be adjustable in the lengthwise direction of the process chamber 200. Similarly, the location of one or more outlet ports 234 in tube(s) 232 of gas outlet 230 may be adjustable in the lengthwise direction of the process chamber 200.

The angular (i.e., circumferential) and/or vertical (i.e., lengthwise) position of the gas inlet 210 and/or gas outlet 230 may adjusted such that there is a uniform flow of hot gas through the process chamber 200. In some embodiments, the size and/or position of the inlet ports 214 and/or outlet ports 234 may also be adjusted to achieve the desired air flow pattern in process chamber 200. Although not required, in some embodiments the vertical gap between substrates 32 and panels 62 may be substantially the same as the vertical spacing between inlet ports 214 in tubes 212. In some embodiments, the vertical spacing between the inlet ports 214 may be adjusted to be substantially the same as the vertical gap between the substrates 32 and panels 62. In some embodiments, the vertical gap between the substrates 32 and panels 62 may adjusted such that it is substantially the same as the vertical spacing between the inlet ports 214. For example, if the vertical spacing between inlet ports 214 is, for example, about 25 mm (or any other value), the spacing between the substrates 32 and panels 62 in rack 80 may be about the same value. Additionally, in some embodiments, the inlet ports 214 may be arranged such that their vertical position aligns with the gaps between substrates 32 and panels 62 in rack 82.

Magnet 500 may be positioned such that opposite poles 510, 512 (i.e., north and south poles) of magnet 500 are positioned on diametrically opposite sides of process chamber 200 such the magnetic field between opposite poles 510, 512 passes through rack 80. As best seen in FIG. 4B, in some embodiments, opposite poles 510 of magnet 500 are arranged such that the magnetic field between the poles (i.e., magnetic flux 514 between poles) is in the same direction as gas flow between gas inlet and gas outlet 210, 230. Thus, north pole 510 of magnet 500 is aligned with gas inlet 210 and south pole 512 is aligned with gas outlet 230. In such embodiments, the hot air flow in the oven is in the same direction as the magnetic flux provided by magnet 50. As illustrated in FIG. 4B, the magnetic flux 514 and the gas flow from gas inlet to gas outlet 210, 230 may be in the same geometric plane (XY plane in FIG. 4B) as the substrates 32 and panels 62 in rack 80.

Figure 4D:
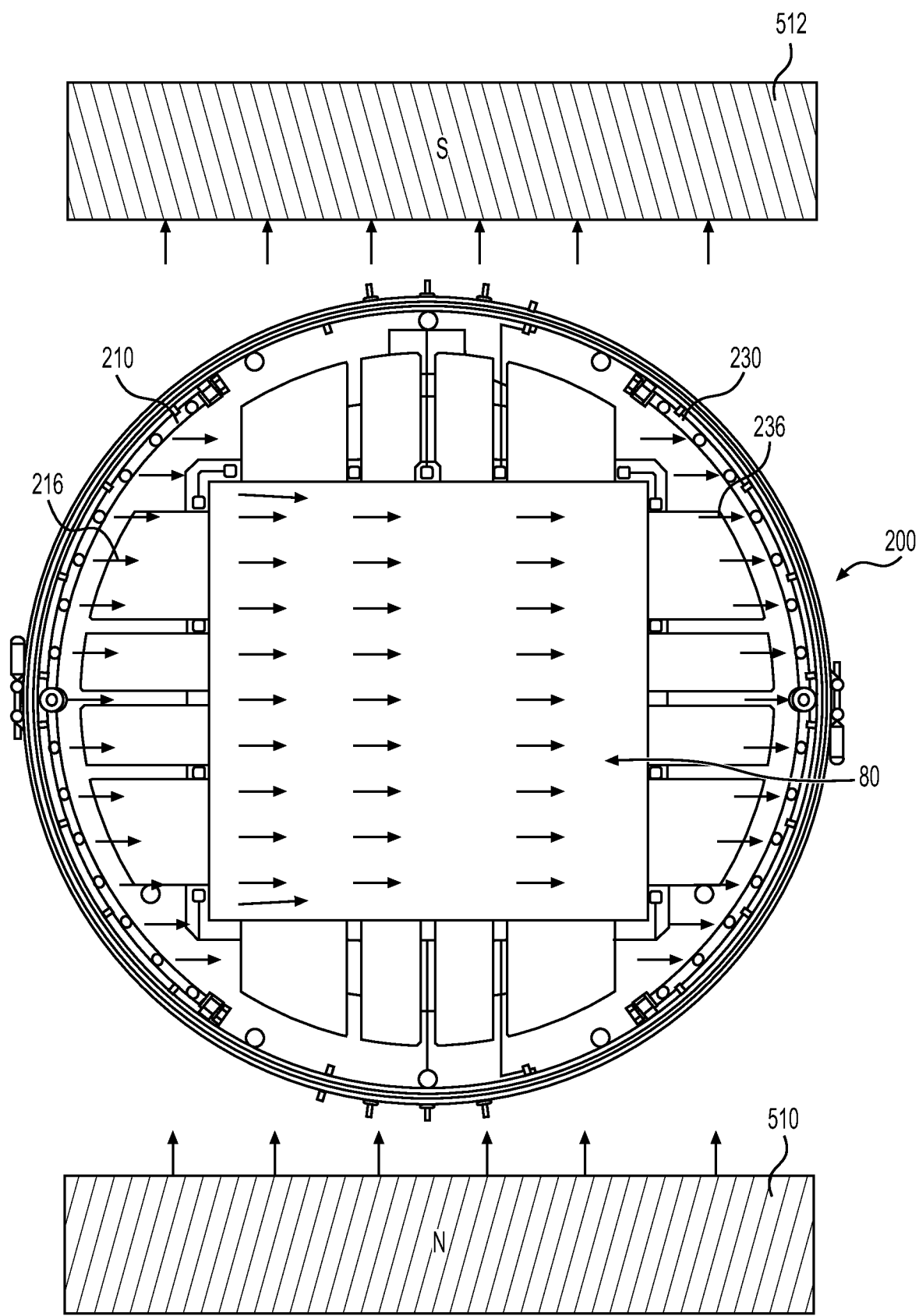

In some embodiments, north pole 510 may aligned with gas outlet 230 and south pole 512 may be aligned with gas inlet 210 such that the magnetic field between the poles (i.e., magnetic flux 514 that extends between poles) is in the same plane but in the opposite direction as the gas flow between gas inlet and gas outlet 210, 230. In some embodiments, as illustrated in FIG. 4D, the opposite poles 510, 512 of magnet 500 may be rotated such that the magnetic field between the poles (i.e., magnetic flux 514 that extends between the poles) is in the same plane but transverse to the direction of gas flow between gas inlet and gas outlet 210, 230. In such an embodiment, the multiple tubes 212, 232 that form the gas inlet 210 and gas outlet 230 are not in the path of (and thus do not interfere with) the magnetic field. In some embodiments, the circumferential position of the gas inlet 210 and/or the gas outlet 230 in the process chamber 200 may be adjusted such that a desired orientation of the gas flow with respect to the magnetic field is achieved.

In use, elevator assembly 300 (see FIG. 3B) lifts seal plate 202 (with rack 80) and seals it against the walls of process chamber 200 such that rack 80 (loaded with substrates 32 and panels 62) is sealed within process chamber 200. After sealing, processing may be carried out in process chamber 200. In some embodiments, processing may include subjecting substrates 32 in rack 80 to one or more high temperature steps in a magnetic field (e.g., magnetic annealing). In some embodiments, processing may also include subjecting the substrates to one or more high or low pressure (e.g., vacuum pressure) steps. For high (or low) temperature processing of substrates 32 in rack 80, gas entering process chamber 200 through gas inlet 210 may be heated (or cooled). For example, after loading rack 80 in process chamber 200, chamber 200 may be heated and/or cooled in accordance with a desired temperature profile. During a heating step, hot gas is directed into chamber 200 through gas inlet 210 to heat substrates 32. In some embodiments, magnet 500 may also be activated when substrates 32 are heated so that substrates 32 are concurrently subjected to a magnetic field. As explained previously, in some embodiments, the direction of the magnetic field (from north to south pole) may be in the same direction as the direction of gas flow from gas inlet 210 to gas outlet 230. During a cooling step, cool gas may be directed into process chamber 200 to cool substrates 32 (with or without a magnetic field).

During heating, hot gas flows through the vertical gap (or spacing) between substrates 32 and panels 62 in rack 80 and heats the opposite surfaces (top and bottom surfaces) of substrates 32 by convention. Similarly, during cooling, cool gas flowing through these gaps cools substrates 32. Along with substrates 32, panels 62 (in rack 80) above and below substrates 32 also gets heated or cooled by the gas flowing through the gaps. During heating, in addition to convection heat transfer from hot gas, heated panels 62 heat adjacent substrates 32 by radiation. For example, with reference to FIG. 4A, panel A heats substrate x (and the substrate above panel A) by radiation and panel B heats substrate y (and the substrate positioned below panel B) by radiation. Thus, during heating step, substrates 32 in process chamber 200 are heated by convection from hot gas flowing across surfaces of substrates 32 and by radiation from heated panels 62. This combined heating of substrates 32 increases their rate of heating (or ramp rate) and reduces time needed to reach any desired temperature. Similarly, during the cooling step, panels 62 absorb heat from adjacent substrates 32 and assist in increasing the rate of cooling of substrates 32. In some embodiments, the location and/or size of the gas inlet 210 (or the inlet port of the gas inlet) and/or gas outlet 230 may be adjusted to achieve a desired flow rate or pattern of gas flow in the process chamber 200.

Thus, positioning panels 62 above and below substrates 32 in rack 80 in a vertically spaced-apart manner assists in increasing the rate of heating and cooling of substrates 32. The vertical gaps between substrates 32 and panels 62 in rack 80 allows the gas to flow between them and evenly heat and cool all regions (e.g., center, edges, etc.) of substrates 32. Concurrent with (or independent of) heating and/or cooling, a constant or a varying magnetic flux may be applied to substrates 32 in process chamber 200 by controlling magnet 50. Applying a magnetic flux during heating (and/or cooling) enables process chamber 200 to be used for processes, such as, for example, magnetic annealing.

In some embodiments, in addition to heating substrates 32 using hot gas introduced into process chamber 200 through gas inlet 210, process chamber 200 may also be heated using band heaters 310, 312, 314 (see FIGS. 3B, 4A) on the external wall of process chamber 200. In some embodiments, the substrate may have a similar shape (e.g., circular shape) as the walls of process chamber 200 such that the band heaters 310, 312, and 314 heat the substrates uniformly. In some embodiments, separately controlling these heaters 310, 312, 314 may assist in maintaining a uniform temperature in process chamber 200. For example, heater 310 may be selectively activated and controlled to increase the temperature of substrates 32 in the lower region of process chamber 200, etc. Details of process chamber 200, in some embodiments, are described in U.S. patent application Ser. No. 17/218,697, filed on Mar. 31, 2021, which is incorporated herein by reference in its entirety.

Process module 100 may include multiple sensors that measure several operating parameters of process chamber 200. Sensors may include temperature sensors (e.g., thermocouples), magnetic field sensors, pressure sensors, flow sensors, oxygen sensors, etc. For example, thermocouples in process chamber 200 may measure the temperature distribution in chamber 200, one or more magnetic field sensors may measure the magnetic field of magnet 50, one or more pressure sensors may measure the chamber pressure, flow sensors may measure the flow rate of gas into process chamber 200, etc.

Control system 40 (see FIG. 1A) may control the operations of oven 1000 (including process module 100) using input from these sensors. As known by people skilled in the art, control system 40 may include one or more processors, memory devices, and/or other electronic devices for receiving sensor input, analyzing the received input, and controlling the operation of process module 100 (including process chamber 200, magnet 50, etc.) based on received data, and providing feedback to user of oven 1000. Control system 40 may be configured to receive (from a user) and store multiple process recipes (i.e., temperature and/or magnetic field and/or pressure profiles) that may be run in process chamber 200. In some embodiments, user may select (and in some case, modify) a stored process recipe for execution, and control system 40 may run the selected recipe. Control system 40 may then receive sensor input, and using the received feedback, control the operation of oven 1000. In some embodiments, control system 40 may include a proportional-integral-derivative (PID) controller that controls process module 100 using feedback from the sensors.

A wide variety of process steps may be performed in process chamber 200 of the present disclosure. In some of these processes, substrates 32 in rack 80 positioned in process chamber 200 may be subject to a temporal temperature/magnetic field/pressure profile. U.S. Pat. Nos. 10,147,617 and 10,319,612, and U.S. patent application Ser. No. 17/218,697 (filed Mar. 31, 2021), which are incorporated herein by reference in their entireties, describe some exemplary processing steps that may be carried out in process chamber 200.

The above-described embodiments of the batch processing oven and method of operating the oven are only exemplary. Many variations are possible. For example, although magnet 500 is shown as being positioned outside process chamber 200 (see, for example, FIG. 4C), this is only exemplary. In some embodiments, magnet 500 will be positioned within process chamber 200 with its poles 510, 512 positioned on diametrically opposite sides of rack 80 such that the direction of magnetic flux and gas flow are the same. Other embodiments of the oven will be apparent to those skilled in the art from consideration of the batch processing ovens disclosed herein.

What is claimed is:

1. A batch processing oven, comprising:
   a processing chamber, the processing chamber having a gas inlet configured to direct a gas into the processing chamber and a gas outlet configured to exhaust the gas from the processing chamber, wherein the gas inlet is positioned on a first side of the processing chamber and the gas outlet is positioned on a second side of the processing chamber, substantially opposite the first side, and wherein the gas inlet includes multiple inlet tubes fluidly connected to a source of a single gas and extending in a lengthwise direction of the processing chamber along an internal wall of the processing chamber, the multiple inlet tubes being arranged circumferentially to form a partial arc around the internal wall and the multiple inlet tubes are adjustable in a circumferential direction of the processing chamber;
   a magnet configured to have a north pole and a south pole, wherein the north pole is positioned on the first side of the processing chamber and the south pole is positioned on the second side of the processing chamber such that a magnetic field between the north and south poles of the magnet is in a same direction as gas flow between the gas inlet and the gas outlet; and
   a rack configured to be positioned between the first and second sides of the processing chamber, wherein rack is configured to support a plurality of vertically spaced-apart substrates.

2. The oven of claim 1, wherein the rack is configured to support the plurality of substrates and a plurality of panels in a stacked manner such that (a) one or more substrates of the plurality of substrates are positioned between a pair of adjacent panels of the plurality panels, and (b) vertical gaps separate each substrate of the plurality of substrates from an adjacent substrate or panel on either side of the substrate.

3. The oven of claim 2, wherein the vertical gaps that separate each substrate of the plurality of substrates from an adjacent substrate or panel is between 2 mm and 50 mm.

4. The oven of claim 1, wherein the processing chamber has a substantially cylindrical shape and the first and second sides of the processing chamber are diametrically opposite sides of the processing chamber.

5. The oven of claim 1, wherein the gas inlet includes between 6-20 inlet tubes.

6. The oven of claim 5, wherein the multiple inlet tubes of the gas inlet are adjustable in the circumferential direction such that a spacing between adjacent inlet tubes in the circumferential direction changes.

7. The oven of claim 5, wherein the multiple inlet tubes of the gas inlet is adjustable in the lengthwise direction.

8. The oven of claim 5, wherein each inlet tube of the multiple inlet tubes includes a plurality of inlet ports spaced apart from each other in the lengthwise direction.

9. The oven of claim 8, wherein a size of at least one inlet port of the plurality of inlet ports is adjustable.

10. The oven of claim 8, wherein a location of at least one inlet port of the plurality of inlet ports is adjustable in the lengthwise direction.

11. The oven of claim 5, wherein the gas outlet includes multiple outlet tubes extending in the lengthwise direction along the internal wall of the processing chamber, the multiple outlet tubes being arranged circumferentially to form a partial arc around the internal wall, and wherein each outlet tube of the multiple outlet tubes includes a plurality of outlet ports spaced apart from each other in the lengthwise direction.

12. The oven of claim 11, wherein the multiple outlet tubes of the gas outlet are adjustable in at least one of the circumferential direction of the processing chamber or the lengthwise direction.

13. The oven of claim 11, wherein at least one of a size or a location in the lengthwise direction of at least one outlet port of the plurality of outlet ports is adjustable.

14. The oven of claim 1, wherein the processing chamber includes one or more radiative heaters positioned on an external wall of the processing chamber.

15. The oven of claim 1, wherein the magnet is a permanent magnet.

16. The oven of claim 1, wherein the magnet is an electromagnet.

17. The oven of claim 1, wherein the north pole and the south pole of the magnet are positioned outside the processing chamber and proximate to the chamber walls.

18. The oven of claim 1, wherein the rack includes a plurality of thermocouples, and the oven further includes a control system configured to control operation of the processing chamber using signals from the plurality of thermocouples as feedback.

19. The oven of claim 1, wherein the processing chamber has a chamber opening at a bottom side of the processing chamber, and the rack is configured to be elevated into the processing chamber through the chamber opening.

20. The oven of claim 1, wherein the multiple inlet tubes of the gas inlet are adjustable in the circumferential direction such that the multiple inlet tubes are collectively rotated in the processing chamber.

* * * * *